US012476201B2

United States Patent
Ogawa et al.

(10) Patent No.: US 12,476,201 B2
(45) Date of Patent: Nov. 18, 2025

(54) METHOD FOR MANUFACTURING ELECTRONIC COMPONENT, RESIN COMPOSITION FOR TEMPORARY PROTECTION, AND RESIN FILM FOR TEMPORARY PROTECTION

(71) Applicant: Showa Denko Materials Co., Ltd., Tokyo (JP)

(72) Inventors: Saeko Ogawa, Tokyo (JP); Shogo Sobue, Tokyo (JP)

(*) Notice: Subject to any disclaimer, the term of this patent is extended or adjusted under 35 U.S.C. 154(b) by 463 days.

(21) Appl. No.: 18/000,130

(22) PCT Filed: May 21, 2021

(86) PCT No.: PCT/JP2021/019465
§ 371 (c)(1),
(2) Date: Nov. 29, 2022

(87) PCT Pub. No.: WO2021/251112
PCT Pub. Date: Dec. 16, 2021

(65) Prior Publication Data
US 2023/0197630 A1    Jun. 22, 2023

(30) Foreign Application Priority Data

Jun. 9, 2020  (JP) .................................. 2020-100279

(51) Int. Cl.
*H01L 23/552*   (2006.01)
*C08J 5/18*      (2006.01)
(Continued)

(52) U.S. Cl.
CPC .............. *H01L 23/552* (2013.01); *C08J 5/18* (2013.01); *C08L 33/14* (2013.01); *H01L 21/561* (2013.01);
(Continued)

(58) Field of Classification Search
CPC ............... H01L 23/552; H01L 21/6836; H01L 2221/68327; H01L 21/78; H01L 21/563;
(Continued)

(56) References Cited

U.S. PATENT DOCUMENTS

| | | | |
|---|---|---|---|
| 2013/0137218 A1* | 5/2013 | Morita | H01L 23/293 428/413 |
| 2016/0075871 A1* | 3/2016 | Morita | H01L 24/94 525/481 |
| 2020/0006087 A1* | 1/2020 | Yamaguchi | C08J 7/18 |

FOREIGN PATENT DOCUMENTS

| | | |
|---|---|---|
| JP | H9-223761 | 8/1997 |
| JP | 3824742 | 9/2006 |

(Continued)

OTHER PUBLICATIONS

International Search Report dated Jul. 13, 2021 for PCT/JP2021/019465.

(Continued)

*Primary Examiner* — Didarul A Mazumder
(74) *Attorney, Agent, or Firm* — SOEI PATENT & LAW FIRM

(57) ABSTRACT

A method for producing an electronic component having an electromagnetic shield includes: sticking a temporary protective material to a body to be processed having irregularities on a surface thereof; curing the temporary protective material by light irradiation; singularizing the body to be processed and the temporary protective material; forming a metal film at a part of the singularized body where the temporary protective material is not stuck; and detaching the singularized body having the metal film formed thereon from the temporary protective material. The temporary protective material is formed from a resin composition having a shear viscosity at 35° C. of 5000 to 30000 Pa·s before photocuring and having an elastic modulus at 25° C.

(Continued)

of 100 MPa or less and an elongation percentage of 35% or more in a tensile test, after photocuring by light irradiation with an exposure amount of 500 mJ/cm$^2$ or greater.

15 Claims, 1 Drawing Sheet

(51) Int. Cl.
*C08L 33/14* (2006.01)
*H01L 21/56* (2006.01)
(52) U.S. Cl.
CPC ........ *C08J 2333/14* (2013.01); *C08J 2433/04* (2013.01); *C08J 2483/07* (2013.01)
(58) Field of Classification Search
CPC . H01L 23/3157; H01L 23/296; H01L 21/561; H01L 23/00; H01L 21/301; C08L 33/14; C08L 33/08; C08L 33/04; C08L 83/04; C08J 2433/04; C08J 2333/14; C08J 2483/07; C09J 133/00; C08K 3/01; C08K 5/54

USPC ........................................................ 438/114
See application file for complete search history.

(56) References Cited

FOREIGN PATENT DOCUMENTS

| | | |
|---|---|---|
| JP | 2013-074200 | 4/2013 |
| JP | 2015-089926 | 5/2015 |
| JP | 2015-220377 | 12/2015 |
| JP | 2017-054891 | 3/2017 |
| JP | 2019-102745 | 6/2019 |
| JP | 2019-140201 | 8/2019 |
| WO | 2018/055859 | 3/2018 |
| WO | WO2018143014 * 8/2018 ........ C08F 220/1804 |

OTHER PUBLICATIONS

International Preliminary Report on Patentability with Written Opinion dated Dec. 22, 2022 for PCT/JP2021/019465.

* cited by examiner

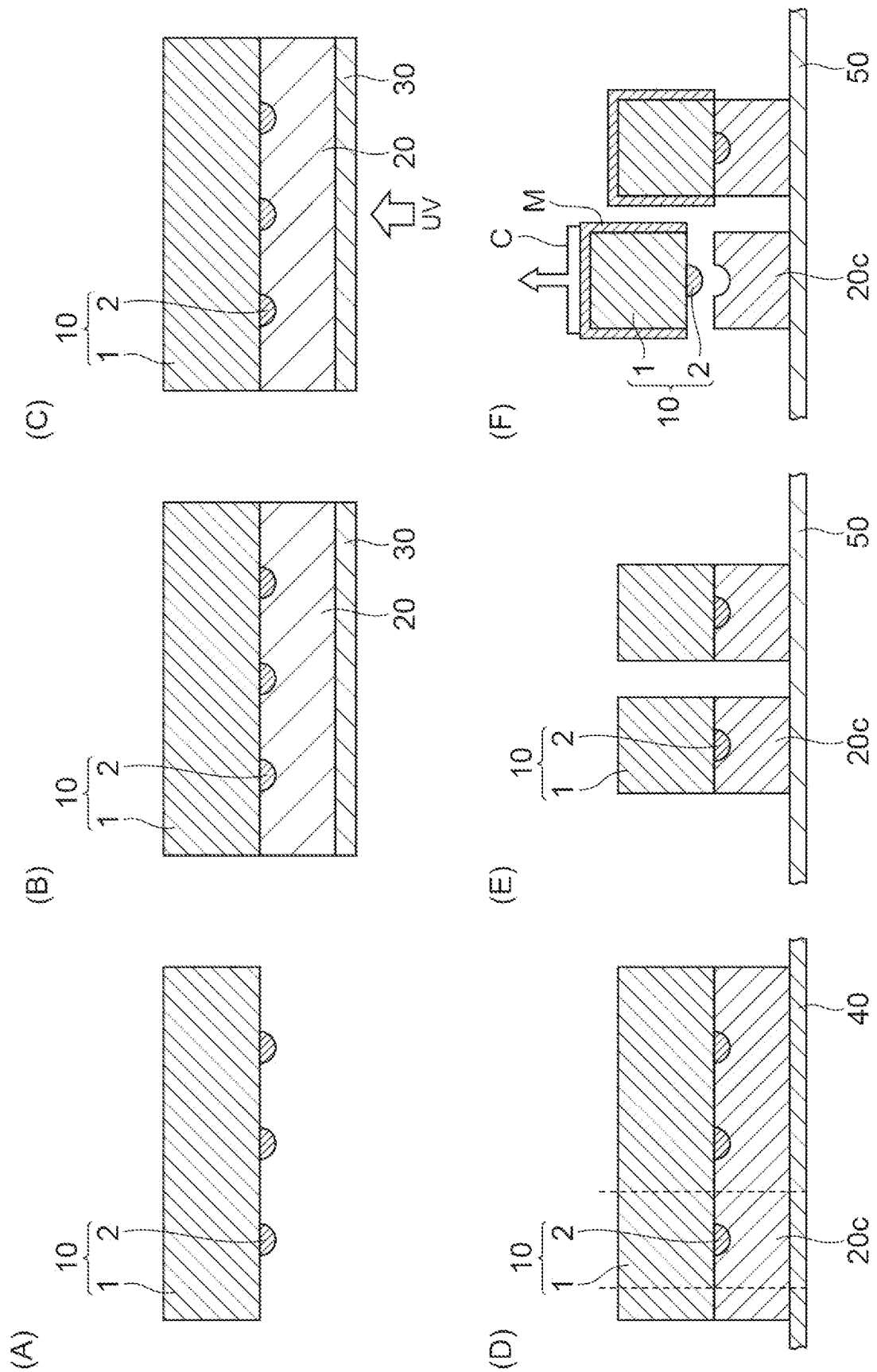

METHOD FOR MANUFACTURING ELECTRONIC COMPONENT, RESIN COMPOSITION FOR TEMPORARY PROTECTION, AND RESIN FILM FOR TEMPORARY PROTECTION

CROSS-REFERENCE TO RELATED APPLICATIONS

This application is a 35 U.S.C. § 371 national phase application of PCT/JP2021/019465, filed on May 21, 2021, which claims priority to Japanese Patent Application No. 2020-100279, filed on Jun. 9, 2020.

TECHNICAL FIELD

The present invention relates to a method for producing an electronic component, and a resin composition for temporary protection and a resin film for temporary protection used in the method for producing an electronic component.

BACKGROUND ART

Along with multi-functionalization, globalization, and the like of electronic equipment such as smartphones and tablet PCs, the number of wireless systems to be installed therein has increased. On the other hand, the clock frequencies and the data transmission rates of built-in circuits have become larger, and noise in the frequency bands used in those wireless systems is likely to occur. Conventionally, as a countermeasure against such noise, electromagnetic shielding of surrounding a circuit having a noise source with a metal plate has been adopted (see, for example, Patent Literatures 1 and 2).

CITATION LIST

Patent Literature

Patent Literature 1: Japanese Patent No. 3824742
Patent Literature 2: Japanese Unexamined Patent Publication No. H9-223761

SUMMARY OF INVENTION

Technical Problem

However, in the technologies described in the above-described patent literatures, the areas required for mounting are large. Therefore, the height is increased depending on the circuit to which electromagnetic shielding is provided, and this becomes a hampering factor for size reduction and thickness reduction of electronic equipment.

From such a circumstance, a new method of forming a film of electromagnetic shield by sputtering a metal serving as an electromagnetic shield material on a circuit having a noise source has been proposed. Examples of the electronic component to which electromagnetic shield is provided include a BGA (Ball Grid Array) package and the like. In recent years, in addition to size reduction and thickness reduction of a BGA package and the like, the structure itself is becoming more complicated, and it is also required to form an electromagnetic shield in a desired part for such an electronic component.

With regard to such a forming method, a method of temporarily protecting a part where an electromagnetic shield is not provided may be considered; however, it is required to suitably remove the resin composition after the shield is formed. When the removal of the resin composition is insufficient, there is a risk that the reliability of an electronic component may be impaired due to the residue of the resin composition.

The present invention was achieved in view of the above-described circumstances, and it is an object of the invention to provide a method for producing an electronic component having an electromagnetic shield and having excellent reliability. It is another object of the present invention to provide a resin composition for temporary protection for forming a temporary protective material, and a resin film for temporary protection obtained by forming the resin composition for temporary protection into a film shape, both of which are used in the above-mentioned production method.

Solution to Problem

The inventors of the present invention repeatedly conducted a thorough investigation on the selection of the resin for the temporary protective material used in the process and the adjustment of the physical properties, in order to solve the above-described problems. Further, the inventors found that it is extremely important for solving the problems to use a specific production process in combination with a temporary protective material formed from a resin composition in which viscosity, elastic modulus, and elongation percentage are appropriately controlled, thus completing the present invention.

The present invention provides a method for producing an electronic component having an electromagnetic shield, the method comprising: a sticking step of sticking a temporary protective material to a body to be processed having irregularities on the surface; a photocuring step of curing the temporary protective material by light irradiation; a dicing step of singularizing the body to be processed and the temporary protective material; a shielding step of forming a metal film on a part of the singularized body to be processed, to which the temporary protective material is not stuck; and a detachment step of detaching the body to be processed having a metal film formed thereon from the temporary protective material. The temporary protective material used in this production method is formed from a resin composition for temporary protection that has a shear viscosity at 35° C. of 5000 to 30000 Pa·s and has an elastic modulus at 25° C. of 100 MPa or less and an elongation percentage of 35% or more in a tensile test after light irradiation with an exposure amount of 500 mJ/cm² or greater.

According to the production method of the present invention, a small-sized electronic component on which an electromagnetic shield of a metal film is formed in a desired part, and which has excellent reliability, is produced.

Generally, when a body to be processed and an adhesive material such as a temporary protective material are bonded together, a phenomenon called bleeding may occur, in which the adhesive material protrudes from an end part and wraps around a lateral surface of the body to be processed. When a metal film is formed on a body to be processed in a state where bleeding has occurred, the metal film is also formed on the bleeding itself, and therefore, when the bleeding is detached together with the temporary protective material, the part where a metal film is not formed in the lateral surface of the body to be processed is exposed. For that reason, for example, even when it is attempted to prepare a body to be processed whose size has been reduced in advance by dicing or the like, and to form a metal film by simply sticking the body to be processed and the temporary protective material together, it is difficult to obtain an electronic component having a desired electromagnetic shield due to the influence of the above-described bleeding.

Thus, it is conceivable to consider a resin design that does not cause bleeding. However, when suppression of bleeding is excessively required, the temporary protective material cannot sufficiently embed the irregularities present on the body to be processed. When the embedding properties are insufficient, voids remain at the sticking interface, and therefore, gaps are produced at the sticking interface due to swelling of the voids at the time of heating when forming the metal film. As a result, a metal film is formed even at a part that should be protected by the temporary protective material.

In order to cope with this problem, in the present invention, a way has been devised in the aspects of process and in the aspects of resin physical properties such that the problem of bleeding that may occur on the lateral surface of the body to be processed when the temporary protective material is stuck does not necessarily have to be dealt with (may be neglected), while the embedding properties of the surface irregularities caused by the temporary protective material are secured. According to the present invention, at least the sticking step of sticking the body to be processed and the temporary protective material together is carried out, and then the dicing step of singularizing an integrated body of the two is carried out. By carrying out each of the steps in this order, a sample for forming a metal film can be obtained while avoiding an end part of the body to be processed where bleeding may occur. The resin composition to be used in forming the temporary protective material satisfies the physical property of having a shear viscosity at 35° C. of 30000 Pa·s or less. Therefore, sufficient embedding properties before curing can be secured.

Furthermore, in the above-described production process of using a resin composition, the body to be processed and the temporary protective material are detached after a metal film is formed; however, at that time, residues derived from the temporary protective material may adhere to the body to be processed. For example, in the case of a package having surface irregularities that are large to a certain extent, residues adhere to recessed parts, and satisfactory detachability may not be obtained. The temporary protective material according to the present invention is also devised such that adhesion of such residues does not occur. The resin composition used in forming the temporary protective material satisfies the physical properties of having a shear viscosity at 35° C. before curing of 5000 Pa·s or more and having an elastic modulus at 25° C. of 100 MPa or less and an elongation percentage of 35% or more in a tensile test after light irradiation with an exposure amount of 500 mJ/cm$^2$ or greater. As a result, destruction of the temporary protective material after curing is suppressed at the time of detaching, and therefore, even in a case where surface irregularities that are large to a certain extent are formed on the surface of the body to be processed, excellent detachability can be obtained. Having excellent detachability means that residues derived from the temporary protective material are not likely to adhere to the surface irregularities.

As described above, according to the present invention in which a specific production process and a specific temporary protective material are used in combination, a small-sized electronic component which has a satisfactory electromagnetic shield formed at desired sites including lateral surfaces and which has excellent reliability, can be obtained.

The present invention also provides a resin composition for temporary protection for forming a temporary protective material that is used in a method for producing an electronic component having an electromagnetic shield, the method comprising: a sticking step of sticking a temporary protective material to a body to be processed having irregularities on the surface; a photocuring step of curing the temporary protective material by light irradiation; a dicing step of singularizing the body to be processed and the temporary protective material; a shielding step of forming a metal film at a part of the singularized body to be processed, to which the temporary protective material is not stuck; and a detachment step of detaching the body to be processed having the metal film formed thereon from the temporary protective material. With regard to the resin composition for temporary protection, the shear viscosity at 35° C. is 5000 to 30000 Pa·s, and after light irradiation with an exposure amount of 500 mJ/cm$^2$ or greater, the elastic modulus at 25° C. is 100 MPa or less and the elongation percentage is 35% or more in a tensile test.

By using the specific temporary protective material of the present invention, a small-sized electronic component having a satisfactory electromagnetic shield formed at desired sites including lateral surfaces and having excellent reliability can be obtained in a specific production process. The details thereof are as described above.

The present invention further provides a resin film for temporary protection that is obtained by forming the above-described resin composition for temporary protection into a film shape.

According to an embodiment, the resin composition for temporary protection comprises (A) a (meth)acrylic copolymer, and the (meth)acrylic copolymer may have a carbon-carbon double bond-containing group. As a result, curability by light irradiation can be imparted to the temporary protective material.

According to an embodiment, a weight average molecular weight of (A) the (meth)acrylic copolymer may be 100000 to 350000. As a result, the elastic modulus after curing is likely to be reduced.

According to an embodiment, a double bond equivalent of (A) the (meth)acrylic copolymer may be 500 to 4000. As a result, the elongation after curing is likely to be enhanced.

According to an embodiment, a glass transition temperature (° C.) of (A) the (meth)acrylic copolymer may be −30° C. to 10° C. As a result, the shear viscosity before curing is likely to be enhanced.

According to an embodiment, the resin composition for temporary protection may further comprise (B) a photoradical polymerization initiator. As a result, the elastic modulus after curing is likely to be further enhanced.

According to an embodiment, the resin composition for temporary protection may further comprise (C) a silicone compound. As a result, the detachability between the body to be processed and the temporary protective material is likely to be further enhanced. Particularly, it is possible to easily detach the body to be processed from the temporary protective material without using a solvent.

According to an embodiment, the temporary protective material may have a film shape. As a result, handleability in the production process can be enhanced, and at the same time, sputtering on the body to be processed can be efficiently carried out.

Advantageous Effects of Invention

According to the present invention, a new method for producing an electronic component having an electromagnetic shield can be provided. Furthermore, according to the present invention, a resin composition for temporary protection for forming a temporary protective material, and a resin film for temporary protection that is obtained by forming the resin composition for temporary protection into a film shape, both of which are used in the above-mentioned production method, can be provided.

The resin composition for temporary protection, or the resin film for temporary protection, according to the present invention has satisfactory embedding properties and detachability. Therefore, an electronic component having an electromagnetic shield of a metal film formed at a desired part can be produced by using these resin composition and resin film. Furthermore, an electronic component having excellent reliability can be produced while suppressing the adhesion of residues derived from the temporary protective material to the body to be processed, by using those resin composition and resin film.

BRIEF DESCRIPTION OF DRAWINGS

FIG. 1 is a schematic process diagram illustrating a production method according to an embodiment of the present invention.

DESCRIPTION OF EMBODIMENTS

Hereinafter, suitable embodiments of the present invention will be described in detail. However, the present invention is not intended to be limited to the following embodiments.

<Method for Producing Electronic Component>

The method for producing an electronic component is a method for producing an electronic component having an electromagnetic shield, the method comprising at least: a sticking step of sticking a temporary protective material to a body to be processed having irregularities on the surface; a photocuring step of curing the temporary protective material by light irradiation; a dicing step of singularizing the body to be processed and the temporary protective material; a shielding step of forming a metal film at a part of the singularized body to be processed, to which the temporary protective material is not stuck; and a detachment step of detaching the body to be processed having the metal film formed thereon from the temporary protective material.

Hereinafter, each step will be described with reference to the drawings as appropriate.

(Sticking Step: FIG. 1(A) to FIG. 1(B))

In the present step, a temporary protective material 20 is stuck to a body to be processed 10 having irregularities on the surface. As shown in FIG. 1(A), the body to be processed 10 comprises protrusions 2 on a substrate 1.

The body to be processed 10 is not particularly limited; however, examples thereof include a BGA (Ball Grid Array) package, an LGA (Land Grid Array) package, and the like. Regarding the BGA package, specifically, a semiconductor substrate having a plurality of bumps (protrusions) on one surface and having the other surface encapsulated by an encapsulant material, may be mentioned. The bump height is about 5 to 300 µm.

As the temporary protective material 20, a resin film for temporary protection that is formed from a predetermined resin composition for temporary protection, which will be described below, can be used. That is, the resin film for temporary protection is a film-shaped temporary protective material. This film can comprise a base material film 30 such as a polyethylene terephthalate film, on a surface on the opposite side of the surface that is stuck to the body to be processed.

For the sticking of the body to be processed 10 and the temporary protective material 20, a roll laminator, a vacuum laminator, or the like can be used. For example, in the case of using a vacuum laminator, sticking can be carried out by using a vacuum laminator LM-50×50-S (product name, manufactured by NPC Incorporated), a vacuum laminator V130 (product name, manufactured by Nikko-Materials Co., Ltd.), or the like, under the conditions of an air pressure of 1.5 hPa or less (preferably 1 hPa or less), a lamination temperature of 25° C. to 180° C. (preferably 40° C. to 120° C.), a lamination pressure of 0.01 to 0.5 MPa (preferably 0.1 to 0.5 MPa), and a retention time of 1 to 600 seconds (preferably 30 to 300 seconds).

(Photocuring Step: FIG. 1(C))

In the present step, the temporary protective material 20 stuck to the body to be processed 10 is subjected to light irradiation, and the temporary protective material is photocured. Light irradiation can be carried out on the base material film 30 side on the surface opposite to the sticking surface of the temporary protective material 20. In the diagram, the photocured temporary protective material 20 is designated as temporary protective material 20c.

Examples of the light to be irradiated include ultraviolet radiation (UV), and the light is irradiated such that the exposure amount (cumulative irradiation amount) for the temporary protective material 20 is 500 mJ/cm$^2$ or greater. The exposure amount is set to at least 500 mJ/cm$^2$ because when the exposure amount is less than 500 mJ/cm$^2$, there is a risk that insufficient curing of the temporary protective material may occur. The upper limit of the exposure amount is not particularly limited; however, from the viewpoint of the operation efficiency, the upper limit can be set to about 3000 mJ/cm$^2$. For the light irradiation, for example, a UV-330 HQP-2 type exposure machine (product name, manufactured by ORC MANUFACTURING CO., LTD.) that can irradiate UV can be used.

(Dicing Step: FIG. 1(D))

In the present step, an integrated object of the body to be processed 10 and the photocured temporary protective material 20c is subjected to dicing, and the integrated object is singularized. Specifically, the base material film 30 is peeled off from the temporary protective material 20c, the integrated object is placed on a dicing tape 40, and singularized by using, for example, fully automatic dicing saw DFD-6361 (product name, manufactured by DISCO Inc.) and the like.

The singularized integrated object is conveyed onto a heat-resistant adhesive material tape 50 such as a polyimide tape, as shown in FIG. 1(E), in order to carry out the shielding step that will be described below.

(Shielding Step and Detachment Step: FIG. 1(F))

In the present steps, in the singularized integrated object, a metal film M serving as an electromagnetic shield is formed at least at a part of the body to be processed 10, where the temporary protective material 20c is not stuck, and subsequently, the body to be processed 10 having the metal film M formed thereon and the temporary protective material 20c are detached.

The formation of the metal film M can be carried out by using a known sputtering apparatus (for example, sputtering apparatus SDH series: product name, manufactured by ULVAC, Inc.), for example, under the conditions of a temperature of 60° C. to 150° C. and a pressure of 1×10$^{-1}$ Pa to 10×10$^{-1}$ Pa, by using copper or the like as a target metal. The thickness of the metal film M to be formed is about 0.1 to 10 µm. Since the temporary protective material 20c is detached in the present step, the metal film M may also be formed on the surface of the temporary protective material 20c.

The body to be processed 10 having the metal film M formed thereon is detached from the temporary protective material 20c by, for example, picking up the body to be processed 10 using a predetermined collet C. For the detachment of the two, for example, a die bonder BESTEM-02 (product name, manufactured by Canon Machinery Inc.) and the like can be used.

With regard to the above-described production method, a material formed from a predetermined resin composition for temporary protection that will be described below as the temporary protective material is used. In the following description, a resin composition for temporary protection and a resin film for temporary protection will be described.

<Resin Composition for Temporary Protection>

The resin composition for temporary protection is a resin composition for temporary protection for forming a temporary protective material, which is used in the above-described method for producing an electronic component having an electromagnetic shield. The resin composition for temporary protection has the following physical properties.

The shear viscosity at 35° C. is 5000 to 30000 Pa·s.

The elastic modulus at 25° C. after light irradiation with an exposure amount of 500 mJ/cm$^2$ or greater is 100 MPa or less.

The elongation percentage in a tensile test after light irradiation with an exposure amount of 500 mJ/cm$^2$ or greater is 35% or more.

Specifically, the resin composition for temporary protection is a resin composition for temporary protection for forming a temporary protective material, which is used in a method for producing an electronic component having an electromagnetic shield, the method comprising: a sticking step of sticking a temporary protective material to a body to be processed having irregularities on the surface; a photocuring step of curing the temporary protective material by light irradiation; a dicing step of singularizing the body to be processed and the temporary protective material; a shielding step of forming a metal film at a part of the singularized body to be processed, to which the temporary protective material is not stuck; and a detachment step of detaching the body to be processed having the metal film formed thereon from the temporary protective material, the resin composition having a shear viscosity at 35° C. of 5000 to 30000 Pa·s, an elastic modulus at 25° C. of 100 MPa or less and an elongation percentage of 35% or more in a tensile test, after light irradiation with an exposure amount of 500 mJ/cm$^2$ or greater.

When the above-described resin composition for temporary protection is used, sufficient embedding properties before curing and excellent detachability after curing can be exhibited. Then, by using the resin composition designed in this manner for the above-described specific production steps, a small-sized electronic component on which an electromagnetic shield of a metal film is formed at a desired part, can be produced.

For example, with respect to a body to be processed having surface irregularities with a height number of more than 100 µm, on which solder balls are mounted on a circuit surface, such as a BGA package, it is difficult to bond a conventionally well-known support tape (a back grinding tape, a dicing tape, or the like) to the body to be processed so as to embed the surface irregularities, and to detach the support tape from the surface of the body to be processed after desired processing. Furthermore, even in a case where a resin composition for temporary protection that is designed to be soft in order to embed surface irregularities, there is a risk that residues derived from the temporary protective material may be generated at the time of detachment, depending on the size or shape of the surface irregularities.

When the shear viscosity at 35° C. (shear viscosity before photocuring) of the resin composition for temporary protection is 5000 Pa·s or more, detachment can be achieved while suppressing the generation of residues derived from the temporary protective material at the time of detachment. Furthermore, even in a case where the film is rolled, bleeding of the resin from the end parts can be suppressed. From such a viewpoint, this shear viscosity can be set to 6500 Pa·s or more, and the shear viscosity may be 8000 Pa·s or more and may be 8500 Pa·s or more.

When the shear viscosity at 35° C. (shear viscosity before photocuring) of the resin composition for temporary protection is 30000 Pa·s or less, the temporary protective material can be stuck to the body to be processed without damaging the body to be processed, which is represented by a semiconductor element, and without producing gaps at the time of embedding the surface irregularities. From such a viewpoint, this shear viscosity can be set to 20000 Pa·s or less, and the shear viscosity may be 12000 Pa·s or less.

The shear viscosity can be measured by using, for example, a rheometer (manufactured by Anton Paar Japan K.K., MCR301).

When the elastic modulus at 25° C. (elastic modulus after photocuring) of the resin composition for temporary protection after light irradiation with an exposure amount of 500 mJ/cm$^2$ or greater is 100 MPa or less, an anchor effect at the time of detachment is suppressed, and detachment can be achieved while suppressing the generation of residues. From such a viewpoint, the elastic modulus can be set to 85 MPa or less, and the elastic modulus may be 70 MPa or less and may be 60 MPa or less. The lower limit of the elastic modulus can be set to 20 MPa or more from the viewpoint of satisfactory dicing properties.

The elastic modulus can be measured by using, for example, a dynamic viscoelasticity apparatus Rheogel-E4000 (product name, manufactured by UBM).

When the elongation percentage in a tensile test (elongation percentage at break) of the resin composition for temporary protection after light irradiation with an exposure amount of 500 mJ/cm$^2$ or greater is 35% or more, destruction of the temporary protective material at the time of detachment can be suppressed, and detachment can be achieved while suppressing the generation of residues. From such a viewpoint, this elongation percentage can be set to 40% or more, and the elongation percentage may be 45% or more, may be 50% or more, and may be 55% or more. The upper limit of the elongation percentage can be set to 80% or less from the viewpoint of satisfactory dicing properties.

The elongation percentage can be measured by using, for example, an autograph "AGS-1000" manufactured by SHIMADZU CORPORATION.

According to the present embodiment, the resin composition for temporary protection may have the viscosity, elastic modulus, and elongation percentage such as described above, and the specific composition of the composition is not particularly limited. By appropriately controlling the shear viscosity before photocuring, and the elastic modulus and elongation percentage after photocuring of the resin composition for temporary protection, embedding of irregularities on the surface of the body to be processed before curing and suppression of the generation of residues on the surface of the body to be processed after detachment can be realized, even for a small-sized body to be processed. In the following description, as an example, an embodiment obtained by adding (B) a photoradical polymerization initiator as a photoreaction controlling component and (C) a silicone compound as a mold release component to the main component composed of (A) a (meth)acrylic copolymer will be described; however, those ordinarily skilled in the art can also appropriately implement other modification embodiments.

<(A) (Meth)Acrylic Copolymer>

Regarding the component (A), a (meth)acrylic copolymer having a carbon-carbon double bond-containing group may be mentioned.

An acrylic resin or a methacrylic resin (hereinafter, referred to as "(meth)acrylic resin") as the (meth)acrylic copolymer can have a photosensitive carbon-carbon double bond-containing group. The (meth)acrylic resin can have a photosensitive carbon-carbon double bond-containing group in a side chain. By using such a resin, photosensitivity can be imparted to the temporary protective material formed from the resin composition for temporary protection by using such a resin.

A (meth)acrylic resin having such a feature can be obtained by synthesizing the resin by an existing method. Examples of such a method include a solution polymerization method, a suspension polymerization method, an emulsion polymerization method, a bulk polymerization method, a precipitation polymerization method, a gas phase polymerization method, a plasma polymerization method, a supercritical polymerization method, and the like. Regarding the type of the polymerization reaction, in addition to radical polymerization, cationic polymerization, anionic polymerization, living radical polymerization, living cationic polymerization, living anionic polymerization, coordination polymerization, immortal polymerization, and the like, a technique called ATRP or RAFT can also be used. Among these, it is preferable to synthesize a (meth)acrylic resin by radical polymerization from the viewpoints of economic efficiency, a high reaction rate, and ease of polymerization control, and also from the viewpoint of the convenience of blending that blending can be achieved by using the resin solution obtained by polymerization as it is.

Here, a method of obtaining a (meth)acrylic resin by radical polymerization by using a solution polymerization method will be described in detail as an example.

The monomer used at the time of synthesizing a (meth) acrylic resin is not particularly limited as long as the monomer has one (meth)acryloyl group in one molecule. Specific examples of such a monomer include aliphatic (meth)acrylates such as methyl (meth)acrylate, ethyl (meth) acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth) acrylate, heptyl (meth)acrylate, octyl heptyl (meth)acrylate, nonyl (meth)acrylate, decyl (meth)acrylate, undecyl (meth) acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth) acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono(2-(meth)acryloyloxyethyl) succinate; alicyclic (meth)acrylates such as cyclopentyl (meth)acrylate, cyclohexyl (meth)acrylate, cyclopentyl (meth)acrylate, dicyclopentanyl (meth)acrylate, dicyclopentenyl (meth)acrylate, isobornyl (meth)acrylate, mono(2-(meth)acryloyloxyethyl) tetrahydrophthalate, and mono(2-(meth)acryloyloxyethyl) hexahydrophthalate; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonylphenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate; heterocyclic (meth)acrylates such as 2-tetrahydrofurfuryl (meth)acrylate, N-(meth)acryloyloxyethyl hexahydrophthalimide, and 2-(meth)acryloyloxyethyl-N-carbazole, caprolactone modification products of these, ω-carboxypolycaprolactone mono (meth)acrylate, compounds having an ethylenically unsaturated group and an epoxy group, such as glycidyl (meth) acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-epoxybutyl (meth) acrylate, 3,4-epoxyheptyl (meth)acrylate, α-ethyl-6,7-epoxyheptyl (meth)acrylate, 3,4-epoxycyclohexylmethyl (meth)acrylate, o-vinylbenzyl glycidyl ether, m-vinylbenzyl glycidyl ether, and p-vinylbenzyl glycidyl ether; compounds having an ethylenically unsaturated group and an oxetanyl group, such as (2-ethyl-2-oxetanyl)methyl (meth)acrylate, (2-methyl-2-oxetanyl)methyl (meth)acrylate, 2-(2-ethyl-2-oxetanyl)ethyl (meth)acrylate, 2-(2-methyl-2-oxetanyl)ethyl (meth)acrylate, 3-(2-ethyl-2-oxetanyl)propyl (meth)acrylate, and 3-(2-methyl-2-oxetanyl)propyl (meth)acrylate; compounds having an ethylenically unsaturated group and an isocyanate group, such as 2-(meth)acryloyloxyethyl isocyanate; and compounds having an ethylenically unsaturated group and a hydroxy group, such as 2-hydroxyethyl (meth)acrylate, 2-hydroxypropyl (meth)acrylate, 4-hydroxybutyl (meth)acrylate, 3-chloro-2-hydroxypropyl (meth)acrylate, and 2-hydroxybutyl (meth)acrylate. These monomers can be used in appropriate combinations.

Furthermore, if necessary, styrene, alkylmaleimides such as N-methylmaleimide, N-ethylmaleimide, N-propylmaleimide, N-isopropylmaleimide, N-butylmaleimide, N-isobutylmaleimide, N-2-methyl-2-propylmaleimide, N-pentylmaleimide, N-2-pentylmaleimide, N-3-pentylmaleimide, N-2-methyl-1-butylmaleimide, N-2-methyl-2-butylmaleimide, N-3-methyl-1-butylmaleimide, N-3-methyl-2-butylmaleimide, N-hexylmaleimide, N-2-hexylmaleimide, N-3-hexylmaleimide, N-2-methyl-1-pentylmaleimide, N-2-methyl-2-pentylmaleimide, N-2-methyl-3-pentylmaleimide, N-3-methyl-1-pentylmaleimide, N-3-methyl-2-pentylmaleimide, N-3-methyl-3-pentylmaleimide, N-4-methyl-1-pentylmaleimide, N-4-methyl-2-pentylmaleimide, N-2,2-dimethyl-1-butylmaleimide, N-3,3-dimethyl-1-butylmaleimide, N-3,3-dimethyl-2-butylmaleimide, N-2,3-dimethyl-1-butylmaleimide, N-2,3-dimethyl-2-butylmaleimide, N-hydroxymethylmaleimide, N-1-hydroxyethylmaleimide, N-2-hydroxyethylmaleimide, N-1-hydroxy-1-propylmaleimide, N-2-hydroxy-1-propylmaleimide, N-3-hydroxy-1-propylmaleimide, N-1-hydroxy-2-propylmaleimide, N-2-hydroxy-2-propylmaleimide, N-1-hydroxy-1-butylmaleimide, N-2-hydroxy-1-butylmaleimide, N-3-hydroxy-1-butylmaleimide, N-4-hydroxy-1-butylmaleimide, N-1-hydroxy-2-butylmaleimide, N-2-hydroxy-2- butylmaleimide, N-3-hydroxy-2-butylmaleimide, N-4-hydroxy-2-butylmaleimide, N-2-methyl-3-hydroxy-1-propylmaleimide, N-2-methyl-3-hydroxy-2-propylmaleimide, N-2-methyl-2-hydroxy-1-propylmaleimide, N-1-hydroxy-1-pentylmaleimide, N-2-hydroxy-1-pentylmaleimide, N-3-hydroxy-1-pentylmaleimide, N-4-hydroxy-1-pentylmaleimide, N-5-hydroxy-1-pentylmaleimide, N-1-hydroxy-2-pentylmaleimide, N-2-hydroxy-2-pentylmaleimide, N-3-hydroxy-2-pentylmaleimide, N-4-hydroxy-2-pentylmaleimide, N-5-hydroxy-2-pentylmaleimide, N-1-hydroxy-3-pentylmaleimide, N-2-hydroxy-3-pentylmaleimide, N-3-hydroxy-3-pentylmaleimide, N-1-hydroxy-2-methyl-1-butylmaleimide, N-1-hydroxy-2-methyl-2-butylmaleimide, N-1-hydroxy-2-methyl-3-butylmaleimide, N-1-hydroxy-2-methyl-4-butylmaleimide, N-2-hydroxy-2-methyl-1-butylmaleimide, N-2-hydroxy-2-methyl-3-butylmaleimide, N-2-hydroxy-2-methyl-4-butylmaleimide, N-2-hydroxy-3-methyl-1-butylmaleimide, N-2-hydroxy-3-methyl-2-butylmaleimide, N-2-hydroxy-3-methyl-3-butylmaleimide, N-2-hydroxy-3-methyl-4-butylmaleimide, N-4-hydroxy-2-methyl-1-butylmaleimide, N-4-hydroxy-2-methyl-2-butylmaleimide, N-1-hydroxy-3-methyl-2-butylmaleimide, N-1-hydroxy-3-methyl-1-butylmaleimide, N-1-hydroxy-2,2-dimethyl-1-propylmaleimide, N-3-hydroxy-2,2-dimethyl-1-propylmaleimide, N-1-hydroxy-1-hexylmaleimide, N-1-hydroxy-2-hexylmaleimide, N-1-hydroxy-3-hexylmaleimide, N-1-hydroxy-2-hexylmaleimide, N-1-hydroxy-3-hexylmaleimide, N-1-hydroxy-4-hexylmaleimide, N-1-hydroxy-5-hexylmaleimide, N-1-hydroxy-6-hexylmaleimide, N-2-hydroxy-1-hexylmaleimide, N-2-hydroxy-2-hexylmaleimide, N-2-hydroxy-3-hexylmaleimide, N-2-hydroxy-4-hexylmaleimide, N-2-hydroxy-5-hexylmaleimide, N-2-hydroxy-6-hexylmaleimide, N-3-hydroxy-1-hexylmaleimide, N-3-hydroxy-2-hexylmaleimide, N-3-hydroxy-3-hexylmaleimide, N-3-hydroxy-4-hexylmaleimide, N-3-hydroxy-5-hexylmaleimide, N-3-hydroxy-6-hexylmaleimide, N-1-hydroxy-2-methyl-1-pentylmaleimide, N-1-hydroxy-2-methyl-2-pentylmaleimide, N-1-hydroxy-2-methyl-3-pentylmaleimide, N-1-hydroxy-2-methyl-4-pentylmaleimide, N-1-hydroxy-2-methyl-5-pentylmaleimide, N-2-hydroxy-2-methyl-1-pentylmaleimide, N-2-hydroxy-2-methyl-2-pentylmaleimide, N-2-hydroxy-2-methyl-3-pentylmaleimide, N-2-hydroxy-2-methyl-4-pentylmaleimide, N-2-hydroxy-2-methyl-5-pentylmaleimide, N-2-hydroxy-3-methyl-1-pentylmaleimide, N-2-hydroxy-3-methyl-2-pentylmaleimide, N-2-hydroxy-3-methyl-3-pentylmaleimide, N-2-hydroxy-3-methyl-4-pentylmaleimide, N-2-hydroxy-3-methyl-5-pentylmaleimide, N-2-hydroxy-4-methyl-1-pentylmaleimide, N-2-hydroxy-4-methyl-2-pentylmaleimide, N-2-hydroxy-4-methyl-3-pentylmaleimide, N-2-hydroxy-4-methyl-4-pentylmaleimide, N-2-hydroxy-4-methyl-5-pentylmaleimide, N-3-hydroxy-2-methyl-1-pentylmaleimide, N-3-hydroxy-2-methyl-2-pentylmaleimide, N-3-hydroxy-2-methyl-3-pentylmaleimide, N-3-hydroxy-2-methyl-4-pentylmaleimide, N-3-hydroxy-2-methyl-5-pentylmaleimide, N-1-hydroxy-4-methyl-1-pentylmaleimide, N-1-hydroxy-4-methyl-2-pentylmaleimide, N-1-hydroxy-4-methyl-3-pentylmaleimide, N-1-hydroxy-4-methyl, N-1-hydroxy-3-methyl-1-pentylmaleimide, N-1-hydroxy-3-methyl-2-pentylmaleimide, N-1-hydroxy-3-methyl-3-pentylmaleimide, N-1-hydroxy-3-methyl-4-pentylmaleimide, N-1-hydroxy-3-methyl-5-pentylmaleimide, N-3-hydroxy-3-methyl-1-pentylmaleimide, N-3-hydroxy-3-methyl-2-pentylmaleimide, N-1-hydroxy-3-ethyl-4-butylmaleimide, N-2-hydroxy-3-ethyl-4-butylmaleimide, N-2-hydroxy-2-ethyl-1-butylmaleimide, N-4-hydroxy-3-ethyl-1-butylmaleimide, N-4-hydroxy-3-ethyl-2-butylmaleimide, N-4-hydroxy-3-ethyl-3-butylmaleimide, N-4-hydroxy-3-ethyl-4-butylmaleimide, N-1-hydroxy-2,3-dimethyl-1-butylmaleimide, N-1-hydroxy-2,3-dimethyl-2-butylmaleimide, N-1-hydroxy-2,3-dimethyl-3-butylmaleimide, N-1-hydroxy-2,3-dimethyl-4-butylmaleimide, N-2-hydroxy-2,3-dimethyl-1-butylmaleimide, N-2-hydroxy-2,3-dimethyl-3-butylmaleimide, N-2-hydroxy-2,3-dimethyl-4-butylmaleimide, N-1-hydroxy-2,2-dimethyl-1-butylmaleimide, N-1-hydroxy-2,2-dimethyl-3-butylmaleimide, N-1-hydroxy-2,2-dimethyl-4-butylmaleimide, N-2-hydroxy-3,3-dimethyl-1-butylmaleimide, N-2-hydroxy-3,3-dimethyl-2-butylmaleimide, N-2-hydroxy-3,3-dimethyl-4-butylmaleimide, N-1-hydroxy-3,3-dimethyl-1-butylmaleimide, N-1-hydroxy-3,3-dimethyl-2-butylmaleimide, and N-1-hydroxy-3,3-dimethyl-4-butylmaleimide; cycloalkylmaleimides such as N-cyclopropylmaleimide, N-cyclobutylmaleimide, N-cyclopentylmaleimide, N-cyclohexylmaleimide, N-cycloheptylmaleimide, N-cyclooctylmaleimide, N-2-methylcyclohexylmaleimide, N-2-ethylcyclohexylmaleimide, and N-2-chlorocyclohexylmaleimide; arylmaleimides such as N-phenylmaleimide, N-2-mehtylphenylmaleimide, N-2-ethylphenylmaleimide, and N-2-chlorophenylmaleimide; and the like which are copolymarizable with the above monomers can be appropriately used.

The polymerization initiator required to obtain a (meth)acrylic resin is not particularly limited as long as it is a compound that generates radicals by heating at 30° C. or higher; however, examples thereof include ketone peroxides such as methyl ethyl ketone peroxide, cyclohexanone peroxide, and methyl cyclohexanone peroxide; peroxyketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy)cyclohexane, and 1,1-bis(t-hexylperoxy)-3,3,5-trimethylcyclohexane; hydroperoxides such as p-menthane hydroperoxide; dialkyl peroxides such as α,α'-bis(t-butylperoxy)diisopropylbenzene, dicumyl peroxide, t-butyl cumyl peroxide, and di-t-butyl peroxide; diacyl peroxides such as octanoyl peroxide, lauroyl peroxide, stearyl peroxide, and benzoyl peroxide; peroxycarbonates such as bis(4-t-butylcyclohexyl) peroxydicarbonate, di-2-ethoxyethyl peroxydicarbonate, di-2-ethylhexyl peroxydicarbonate, and di-3-methoxybutyl peroxycarbonate; peroxy esters such as t-butyl peroxypivalate, t-hexyl peroxypivalate, 1,1,3,3-tetramethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxy isopropyl monocarbonate, t-butyl peroxy-3,5,5-trimethylhexanoate, t-butyl peroxylaurylate, t-butyl peroxy isopropyl monocarbonate, t-butyl peroxy-2-ethylhexyl monocarbonate, t-butyl peroxybenzoate, t-hexyl peroxybenzoate, 2,5-dimethyl-2-,5-bis(benzoylperoxy)hexane, and t-butyl peroxyacetate; 2,2'-azobisisobutyronitrile, 2,2'-azobis(2,4-dimethylvaleronitrile), and 2,2'-azobis(4-methoxy-2'-dimethylvaleronitrile).

The reaction solvent that is used at the time of solution polymerization is not particularly limited as long as the reaction solvent can dissolve a (meth)acrylic resin; however, examples thereof include aromatic hydrocarbons such as toluene, xylene, mesitylene, cumene, and p-cymene; cyclic ethers such as tetrahydrofuran and 1,4-dioxane; alcohols such as methanol, ethanol, isopropanol, butanol, ethylene glycol, and propylene glycol; ketones such as acetone methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, and diethylene glycol diethyl ether; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, and diethylene glycol monoethyl ether acetate; and amides such as N,N-dimethylformamide, N,N-dimethylacetamide, and N-methylpyrrolidone. These organic solvents can be used singly or in combination of two or more kinds thereof. Furthermore, polymerization can also be carried out by using supercritical carbon dioxide or the like as a solvent.

Photosensitivity (photocurability) can be imparted to a (meth)acrylic resin by chemically bonding a functional group capable of reacting by irradiation with ultraviolet radiation, an electron beam, and/or visible light. Specific examples of the functional group capable of reacting by irradiation with ultraviolet radiation, an electron beam, and/or visible light, include a (meth)acryloyl group, a vinyl group, an allyl group, a glycidyl group, an alicyclic epoxy group, and an oxetane group.

The method for imparting photosensitivity to a (meth)acrylic resin is not particularly limited; however, for example, when the (meth)acrylic resin is synthesized, a monomer having a functional group that can be subjected to an addition reaction in advance, for example, a hydroxy group, a carboxy group, an anhydrous maleyl group, a glycidyl group, or an amino group, is used to introduce a functional group that can be subjected to an addition reaction into a (meth)acrylic resin, the resulting product is subjected to an addition reaction with a compound having at least one ethylenically unsaturated group and a functional group such as an epoxy group, an oxetanyl group, an isocyanate group, a hydroxy group, a carboxy group, or the like to introduce an ethylenically unsaturated group into a side chain, and thereby photosensitivity can be imparted to the (meth)acrylic resin.

The compound that can impart photosensitivity to a (meth)acrylic resin is not particularly limited, and examples thereof include compounds having an ethylenically unsaturated group and an epoxy group, such as glycidyl (meth) acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-epoxybutyl (meth) acrylate, 3,4-epoxyheptyl (meth)acrylate, α-ethyl-6,7-epoxyheptyl (meth)acrylate, 3,4-epoxycyclohexyl methyl (meth)acrylate, o-vinylbenzyl glycidyl ether, m-vinylbenzyl glycidyl ether, and p-vinylbenzyl glycidyl ether; compounds having an ethylenically unsaturated group and an oxetanyl group, such as (2-ethyl-2-oxetanyl)methyl (meth)acrylate, (2-methyl-2-oxetanyl)methyl (meth)acrylate, 2-(2-ethyl-2-oxetanyl)ethyl (meth)acrylate, 2-(2-methyl-2-oxetanyl)ethyl (meth)acrylate, 3-(2-ethyl-2-oxetanyl)propyl (meth)acrylate, and 3-(2-methyl-2-oxetanyl)propyl (meth)acrylate; compounds having an ethylenically unsaturated group and an isocyanate group, such as (meth)acryloyl isocyanate, 2-(meth)acryloyloxyethyl isocyanate, and m-isopropenyl-α, α-dimethylbenzyl isocyanate; compounds having an ethylenically unsaturated group and a hydroxy group, such as 2-hydroxyethyl (meth)acrylate, 2-hydroxypropyl (meth) acrylate, 3-chloro-2-hydroxypropyl (meth)acrylate, and 2-hydroxybutyl (meth)acrylate; and compounds having an ethylenically unsaturated group and a carboxy group, such as (meth)acrylic acid, crotonic acid, cinnamic acid, (2-(meth)acryloyloxyethyl) succinate, 2-phthaloylethyl (meth) acrylate, 2-tetrahydrophthaloylethyl (meth)acrylate, 2-hexahydrophthaloylethyl (meth)acrylate, ω-carboxypolycaprolactone mono(meth)acrylate, 3-vinylbenzoic acid, and 4-vinylbenzoic acid.

The weight average molecular weight of the component (A) can be set to 100000 to 350000. When the weight average molecular weight is 100000 or more, the heat resistance and detachability of the temporary protective material formed from the resin composition for temporary protection can be further improved, and when the weight average molecular weight is 350000 or less, the film-forming properties and fluidity of the resin composition for temporary protection can be further improved, while the embedding properties for the irregularities on the surface of the body to be processed can be further improved. From this viewpoint, the weight average molecular weight may be 120000 or more, may be 130000 or more, may be 140000 or more, may be 300000 or less, may be 250000 or less, and may be 180000 or less. The weight average molecular weight is a polystyrene-equivalent value obtainable by gel permeation chromatography (GPC) using a calibration curve based on polystyrene standards.

The double bond equivalent of the component (A) can be set to 500 to 4000. When the double bond equivalent is 500 or more, the detachability of the temporary protective material formed from the resin composition for temporary protection can be further improved, and when the double bond equivalent is 4000 or less, the dicing properties of the resin composition for temporary protection can be further improved. From this viewpoint, this double bond equivalent may be 1000 or more, may be 1500 or more, may be 3750 or less, and may be 3500 or less. The double bond equivalent is a calculated value. The double bond equivalent is the molecular weight per one double bond.

The glass transition temperature of the component (A) can be set to −30° C. to 10° C. When the glass transition temperature is −30° C. or higher, the detachability of the temporary protective material formed from the resin composition for temporary protection can be further improved, and when the glass transition temperature is 10° C. or lower, the embedding properties for the irregularities on the surface of the body to be processed can be further improved. From this viewpoint, this glass transition temperature may be −15° C. or higher, may be −10° C. or higher, may be 5° C. or lower, and may be 0° C. or lower. The glass transition temperature is a mid-point glass transition temperature measured by differential scanning calorimetry (DSC). Specifically, the glass transition temperature is a mid-point glass transition temperature obtained by measuring changes in the amount of heat under the conditions of a temperature increase rate of 10° C./min and a measurement temperature of −80° C. to 80° C. and calculated according to a method equivalent to JIS K 7121.

The resin composition for temporary protection may further comprise a non-crosslinkable (meth)acrylic resin in addition to the (meth)acrylic resin mentioned above as an example. That is, the resin composition for temporary protection may comprise a crosslinkable (meth)acrylic resin (component (A)) and a non-crosslinkable (meth)acrylic resin (component (a)).

The non-crosslinkable (meth)acrylic resin is not particularly limited, and any known one can be used. From the viewpoint of realizing appropriate viscosity and elastic modulus of the resin composition for temporary protection, the weight average molecular weight may be 500000 or less, and the glass transition temperature may be about −20° C. to 20° C.

The blending amount of the non-crosslinkable (meth) acrylic resin can be set to 5 to 80 parts by mass with respect to 100 parts by mass of the crosslinkable (meth)acrylic resin and may be 10 to 70 parts. When the proportions of the two are in the above-described range, a film having appropriate elongation is likely to be obtained.

<(B) Photoradical Polymerization Initiator>

Component (B) is not particularly limited as long as it initiates polymerization by irradiation with active light such as ultraviolet radiation or visible light.

The component (B) is not particularly limited, and examples thereof include benzoin ketals such as 2,2-dimethoxy-1,2-diphenylethan-1-one; α-hydroxy ketones such as 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, and 2-hydroxy-1-{4-[4-(2-hydroxy-2-methylpropionyl)benzyl]phenyl}-2-m ethylpropan-1-one; glyoxy esters such as methyl phenylglyoxylate, ethyl phenylglyoxylate, 2-(2-hydroxyethoxy) ethyl oxyphenylacetate, and 2-(2-oxo-2-phenylacetoxyethoxy)ethyl oxyphenylacetate; α-aminoketones such as 2-benzyl-2-dimethylamino-1-(4-morpholin-4-ylphenyl)-butan-1-one, 2-dimethylamino-2-(4-methylbenzyl)-1-(4-morpholin-4-ylphenyl)-butan-1-one, and 1,2-methyl-1-[4-(methylthio)phenyl]-(4-morpholin)-2-ylpropan-1-one; oxime esters such as 1,2-octanedione, 1-[4-(phenylthiol),2-(O-benzoyloxime)], ethenone, 1-[9-ethyl-6-(2-methylbenzoyl)-9H-carbazol-3-yl], and 1-(O-acetyloxime); phosphine oxides such as bis(2,4,6-trimethylbenzoyl) phenyl phosphine oxide, bis(2,6-dimethoxybenzoyl)-2,4,4-trimethylpentyl phosphine oxide, and 2,4,6-trimethylbenzoyl diphenyl phosphine oxide; 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer; benzophenone compounds such as benzophenone, N,N,N',N-tetramethyl-4,4'-diaminobenzophenone, N,N,N',N-tetraethyl-4,4'-diaminobenzophenone, and 4-methoxy-4'-dimethylaminobenzophenone; quinone compounds such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ethers such as benzoin methyl ether, benzoin ethyl ether, and benzoin phenyl ether; benzoin compounds such as benzoin, methylbenzoin, and ethylbenzoin; benzyl compounds such as benzyl dimethyl ketal; acridine compounds such as 9-phenylacridine and 1,7-bis(9,9'-acridinylheptane); N-phenylglycine, coumarin, and the like.

The above-described photoradical polymerization initiators can be used singly or in combination of two or more kinds thereof. Furthermore, the photoradical polymerization initiator can also be used in combination with an appropriate sensitizer.

The blending amount of the component (B) can be set to 0.05 to 10 parts by mass with respect to 100 parts by mass of the component (A). When the blending amount of the component (B) is in the above-described range, sufficient reactivity of the (meth)acrylic monomer is likely to be obtained by sufficient light irradiation.

<(C) Silicone Compound>

When a (meth)acrylic copolymer and a silicone compound are appropriately selected and blended, detachability is improved without preliminary application of a mold release component, and the generation of residues after detachment can be suppressed.

The component (C) may be a compound having a siloxane bonding site, and examples thereof include an organopolysiloxane that does not have a reactive functional group, an organopolysiloxane having a reactive functional group, a silicone-modified polyimide resin, a silicone-modified polyamideimide resin, a silicone-modified alkyd resin, a straight silicone oil, a non-reactive modified silicone oil, a reactive modified silicone oil, and the like. Among these, from the viewpoints of the elastic modulus and detachability of the temporary protective material formed from the resin composition for temporary protection, and compatibility with the component (A), a silicone resin having a reactive functional group can be used. Examples of the reactive functional group include an epoxy group, an oxetanyl group, a carboxy group, a hydroxy group, an amide group, an amino group, an acryloyl group, and the like, and among these, particularly an acryloyl group can be used. These compounds can be used singly or in combination of two or more kinds thereof.

The blending amount of the component (C) can be set to 0.05 to 30 parts by mass with respect to 100 parts by mass of the component (A). When the blending amount of the component (C) is 0.05 parts by mass or more, the detachability of the temporary protective material formed from the resin composition for temporary protection can be improved, and when the blending amount is 30 parts by mass or less, the temporary protective material can be firmly stuck to a body to be processed. From this viewpoint, the blending amount of the component (C) may be 0.1 to 20 parts by mass and may be 0.5 to 15 parts by mass, with respect to 100 parts by mass of the component (A).

From the viewpoint of enhancing heat resistance and machinability, the resin composition for temporary protection can further comprise an inorganic filler.

Examples of the inorganic filler include insulating microparticles and whiskers. Examples of the insulating microparticles include glass, silica, alumina, titanium oxide, carbon black, mica, boron nitride, and the like. Among these, from the viewpoint of handleability, silica, alumina, titanium oxide, and boron nitride can be used, and particularly, silica, alumina, and boron nitride can be used. Examples of the whiskers include aluminum borate, aluminum titanate, zinc oxide, calcium silicate, magnesium sulfate, boron nitride, and the like. These compounds can be used singly or in combination of two or more kinds thereof.

It is preferable that the inorganic filler has an organic group on the surface. As the surface of the inorganic filler is modified by an organic group, the dispersibility in an organic solvent when preparing a resin composition for temporary protection, and the adhesiveness and heat resistance of the temporary protective material formed from the resin composition for temporary protection are easily enhanced.

The average particle size of the inorganic filler can be set to 0.01 to 10 µm. When the average particle size is 0.01 µm or more, since the fluidity of the temporary protective material formed from the resin composition for temporary protection is easily secured, the embedding properties for projecting objects such as bumps on the surface of the body to be processed can be enhanced, and when the average particle size is 10 µm or less, settling of the inorganic filler in the resin composition for temporary protection is easily suppressed. From this viewpoint, the average particle size of the inorganic filler may be 0.05 to 5 µm and may be 0.1 to 3 µm.

The blending amount of the inorganic filler can be set to 1 to 100 parts by mass with respect to 100 parts by mass of the component (A). When the blending amount is 1 part by mass or more, the heat resistance, machinability, and the like of the temporary protective material formed from the resin composition for temporary protection can be improved, and when the blending amount is 100 parts by mass or less, since fluidity of the temporary protective material formed from the resin composition for temporary protection can be secured, the embedding properties for projecting objects such as bumps on the surface of the body to be processed can be improved. From this viewpoint, the blending amount of the inorganic filler may be 3 to 70 parts by mass and may be 5 to 50 parts by mass with respect to 100 parts by mass of the component (A).

The resin composition for temporary protection can further comprise an organic filler. Examples of the organic filler include carbon, a rubber-based filler, silicone-based microparticles, polyamide microparticles, polyimide microparticles, and the like. The blending amount of the organic filler can be set to 50 parts by mass or less with respect to 100 parts by mass of the component (A), and the blending amount may be 40 parts by mass or less and may be 30 parts by mass or less.

In the resin composition for temporary protection, so-called additives such as an oxidation inhibitor, a yellowing inhibitor, a colorant, a plasticizer, and a stabilizer may be further added as necessary, at proportions that do not adversely affect the intended effects.

The resin composition for temporary protection may be further diluted by using an organic solvent as necessary. The organic solvent is not particularly limited as long as it can dissolve the resin composition; however, examples thereof include ketone-based organic solvents such as acetone, methyl ethyl ketone, methyl isobutyl ketone, and cyclohexanone; ester-based organic solvents such as ethyl acetate, butyl acetate, methyl lactate, ethyl lactate, and γ-butyrolactone; polyhydric alcohol alkyl ether-based organic solvents such as ethylene glycol monoethyl ether, ethylene glycol monobutyl ether, ethylene glycol dimethyl ether, ethylene glycol diethyl ether, propylene glycol monomethyl ether, propylene glycol dimethyl ether, diethylene glycol monomethyl ether, diethylene glycol monobutyl ether, and diethylene glycol dimethyl ether; polyhydric alcohol ether acetates such as ethylene glycol monomethyl ether acetate, propylene glycol monomethyl ether acetate, and diethylene glycol monomethyl ether acetate; and amide-based organic solvents such as N,N-dimethylformamide, N,N-dimethylacetamide, and N-methylpyrrolidone. These organic solvents can be used singly or in combination of two or more kinds thereof.

The solid content concentration in the resin composition for temporary protection can be set to 10% to 80% by mass.

A particularly suitable embodiment of the resin composition for temporary protection is a composition containing (A) a (meth)acrylic copolymer, (B) a photoradical polymerization initiator, and (C) a silicone compound from the viewpoint of obtaining appropriate viscosity before light irradiation, an appropriate elastic modulus after light irradiation, mold releasability, and the like, and a composition containing 0.05 to 10 parts by mass of the component (B) and 0.05 to 30 parts by mass of the component (C) with respect to 100 parts by mass of the component (A) may be mentioned.

<Resin Film for Temporary Protection>

A resin film for temporary protection is obtained by forming the resin composition for temporary protection comprising each of the above-mentioned components into a film shape. Specifically, a resin film for temporary protection can be obtained by a method of subjecting the composition to mixing, kneading, and the like in an organic solvent to prepare a varnish, applying the prepared varnish on a base material film, and then heating and drying the varnish.

The above-described mixing, kneading, and the like can be carried out using conventional dispersing machines such as a stirrer, a Raikai mixer, a three-roll, and a ball mill, by appropriately combining these. The above-described heating and drying are not particularly limited as long as the processes are conducted under the conditions in which the used organic solvent is sufficiently volatilized; however, the heating and drying can be usually carried out by heating at 60° C. to 200° C. for 0.1 to 90 minutes.

The organic solvent for preparing the varnish is not limited as long as it can uniformly dissolve, knead, or disperse each of the above-described components, and any conventionally known organic solvent can be used. From the viewpoint of having a fast drying rate and being inexpensive, it is preferable to use methyl ethyl ketone, cyclohexanone, or the like.

The base material film is not particularly limited as long as it transmits light at the time of light irradiation, and examples thereof include a polyester film (polyethylene terephthalate film or the like), a polypropylene film (OPP film or the like), a polyimide film, a polyetherimide film, a polyether naphthalate film, a methylpentene film, and the like.

The thickness of the resin film for temporary protection is preferably a thickness equal to or less than the surface irregularities of the body to be processed, from the viewpoint of sufficiently embedding the irregularities on the surface of the body to be processed, and the thickness is preferably 5 to 300 µm. In a case where the volume of protrusion parts is large, the surface irregularities can be sufficiently embedded even when the thickness of the resin film for temporary protection is smaller than the height of the protrusions.

A resin film for temporary protection in a state of being provided on a base material film such as a polyester film can be referred to as a resin film sheet for temporary protection. That is, the resin film sheet for temporary protection can comprise a base material film and a resin film for temporary protection on the base material film.

Thus, suitable embodiments of the method for producing an electronic component according to the present invention, and the resin composition for temporary protection and the resin film for temporary protection used in the method have been described; however, the present invention is not intended to be necessarily limited to the above-mentioned embodiments, and modifications may be appropriately made to the extent that maintains the gist of the invention.

EXAMPLES

Hereinafter, the present invention will be described more specifically by way of Examples. However, the present invention is not intended to be limited to the following Examples.

<Preparation of (Meth)Acrylic Copolymer>

[(Meth)Acrylic Copolymer A-1]

In an autoclave having a capacity of 4000 ml and equipped with a three-one motor, a stirring blade, and a nitrogen inlet tube, 1000 g of ethyl acetate, 250 g of 2-ethylhexyl acrylate (HA), 560 g of 2-hydroxyethyl acrylate (HEA), 190 g of methyl methacrylate (MMA), 2.0 g of 2,2'-azobisisobutyronitrile, and 10.0 g of a chain transfer agent n-octylmercaptan were blended, and the mixture was stirred until the mixture became uniform. Subsequently, bubbling was performed at a flow rate of 100 ml/min for 60 minutes, and dissolved oxygen in the system was degassed. The temperature was increased to 60° C. for one hour, and after the temperature increase, polymerization was performed for 4 hours. Subsequently, the temperature was increased to 90° C. for one hour, and the system was maintained for one hour at 90° C. and then was cooled to room temperature. Next, 1000 g of ethyl acetate was added to the autoclave, and then the mixture was stirred and diluted. To this, 0.1 g of methoquinone as a polymerization inhibitor and 0.05 g of dioctyltin dilaurate as a urethanization catalyst were added, subsequently 120 g of 2-methacryloyloxyethyl isocyanate (KARENZ MOI manufactured by Showa Denko K.K.: product name) was added thereto, and the mixture was caused to react for 6 hours at 70° C. and then cooled to room temperature. Subsequently, ethyl acetate was added thereto to adjust the content of non-volatile components in the acrylic resin solution to be 35% by mass, and an acrylic resin solution A-1 comprising a (meth)acrylic copolymer A-1 having a chain-polymerizable functional group was obtained.

[(Meth)Acrylic Copolymer A-2]

In an autoclave having a capacity of 4000 ml and equipped with a three-one motor, a stirring blade, and a nitrogen inlet tube, 1000 g of ethyl acetate, 250 g of 2-ethylhexyl acrylate (HA), 560 g of 2-hydroxyethyl acrylate (HEA), 190 g of methyl methacrylate (MMA), 2.0 g of 2,2'-azobisisobutyronitrile, and 10.0 g of a chain transfer agent n-octylmercaptan were blended, and the mixture was stirred until the mixture became uniform. Subsequently, bubbling was performed at a flow rate of 100 ml/min for 60 minutes, and dissolved oxygen in the system was degassed. The temperature was increased to 60° C. for one hour, and after the temperature increase, polymerization was performed for 4 hours. Subsequently, the temperature was increased to 90° C. for one hour, and the system was maintained for one hour at 90° C. and then was cooled to room temperature. Next, 1000 g of ethyl acetate was added to the autoclave, and then the mixture was stirred and diluted. To this, 0.1 g of methoquinone as a polymerization inhibitor and 0.05 g of dioctyltin dilaurate as a urethanization catalyst were added, subsequently 50 g of 2-methacryloyloxyethyl isocyanate (KARENZ MOI manufactured by Showa Denko K.K.: product name) was added thereto, and the mixture was caused to react for 6 hours at 70° C. and then cooled to room temperature. Subsequently, ethyl acetate was added thereto to adjust the content of non-volatile components in the acrylic resin solution to be 35% by mass, and an acrylic resin solution A-2 comprising a (meth)acrylic copolymer A-2 having a chain-polymerizable functional group was obtained.

[(Meth)Acrylic Copolymer A-3]

In an autoclave having a capacity of 4000 ml and equipped with a three-one motor, a stirring blade, and a nitrogen inlet tube, 1000 g of ethyl acetate, 250 g of 2-ethylhexyl acrylate (HA), 560 g of 2-hydroxyethyl acrylate (HEA), 190 g of methyl methacrylate (MMA), 2.0 g of 2,2'-azobisisobutyronitrile, and 12.0 g of a chain transfer agent n-octylmercaptan were blended, and the mixture was stirred until the mixture became uniform. Subsequently, bubbling was performed at a flow rate of 100 ml/min for 60 minutes, and dissolved oxygen in the system was degassed. The temperature was increased to 60° C. for one hour, and after the temperature increase, polymerization was performed for 4 hours. Subsequently, the temperature was increased to 90° C. for one hour, and the system was maintained for one hour at 90° C. and then was cooled to room temperature. Next, 1000 g of ethyl acetate was added to the autoclave, and then the mixture was stirred and diluted. To this, 0.1 g of methoquinone as a polymerization inhibitor and 0.05 g of dioctyltin dilaurate as a urethanization catalyst were added, subsequently 100 g of 2-methacryloyloxyethyl isocyanate (KARENZ MOI manufactured by Showa Denko K.K.: product name) was added thereto, and the mixture was caused to react for 6 hours at 70° C. and then cooled to room temperature. Subsequently, ethyl acetate was added thereto to adjust the content of non-volatile components in the acrylic resin solution to be 35% by mass, and an acrylic resin solution A-3 comprising a (meth)acrylic copolymer A-3 having a chain-polymerizable functional group was obtained.

[(Meth)Acrylic Copolymer A-4]

In an autoclave having a capacity of 4000 ml and equipped with a three-one motor, a stirring blade, and a nitrogen inlet tube, 1000 g of ethyl acetate, 650 g of 2-ethylhexyl acrylate (HA), 350 g of 2-hydroxyethyl acrylate (HEA), and 3.0 g of 2,2'-azobisisobutyronitrile were blended, and the mixture was stirred until the mixture became uniform. Subsequently, bubbling was performed at a flow rate of 100 ml/min for 60 minutes, and dissolved oxygen in the system was degassed. The temperature was increased to 60° C. for one hour, and after the temperature increase, polymerization was performed for 4 hours. Subsequently, the temperature was increased to 90° C. for one hour, and the system was maintained for one hour at 90° C. and then was cooled to room temperature. Next, 1000 g of ethyl acetate was added to the autoclave, and then the mixture was stirred and diluted. To this, 0.1 g of methoquinone as a polymerization inhibitor and 0.05 g of dioctyltin dilaurate as a urethanization catalyst were added, subsequently 100 g of 2-methacryloyloxyethyl isocyanate (KARENZ MOI manufactured by Showa Denko K.K.: product name) was added thereto, and the mixture was caused to react for 6 hours at 70° C. and then cooled to room temperature. Subsequently, ethyl acetate was added thereto to adjust the content of non-volatile components in the acrylic resin solution to be 35% by mass, and an acrylic resin solution A-4 comprising a (meth)acrylic copolymer A-4 having a chain-polymerizable functional group was obtained.

[(Meth)Acrylic Copolymer A-5]

In an autoclave having a capacity of 4000 ml and equipped with a three-one motor, a stirring blade, and a nitrogen inlet tube, 1000 g of ethyl acetate, 250 g of 2-ethylhexyl acrylate (HA), 560 g of 2-hydroxyethyl acrylate (HEA), 190 g of methyl methacrylate (MMA), 2.0 g of 2,2'-azobisisobutyronitrile, and 5.0 g of a chain transfer agent n-octylmercaptan were blended, and the mixture was stirred until the mixture became uniform. Subsequently, bubbling was performed at a flow rate of 100 ml/min for 60 minutes, and dissolved oxygen in the system was degassed. The temperature was increased to 60° C. for one hour, and after the temperature increase, polymerization was performed for 4 hours. Subsequently, the temperature was increased to 90° C. for one hour, and the system was maintained for one hour at 90° C. and then was cooled to room temperature. Next, 1000 g of ethyl acetate was added to the autoclave, and then the mixture was stirred and diluted. To this, 0.1 g of methoquinone as a polymerization inhibitor and 0.05 g of dioctyltin dilaurate as a urethanization catalyst were added, subsequently 120 g of 2-methacryloyloxyethyl isocyanate (KARENZ MOI manufactured by Showa Denko K.K.: product name) was added thereto, and the mixture was caused to react for 6 hours at 70° C. and then cooled to room temperature. Subsequently, ethyl acetate was added thereto to adjust the content of non-volatile components in the acrylic resin solution to be 35% by mass, and an acrylic resin solution A-5 comprising a (meth)acrylic copolymer A-5 having a chain-polymerizable functional group was obtained.

<Evaluation of (Meth)Acrylic Copolymer>

The physical properties of each of the (meth)acrylic copolymers were evaluated. The results are shown in Table 1.

(Measurement of Weight Average Molecular Weight)

The weight average molecular weight (calculated relative to polystyrene standards) of each (meth)acrylic copolymer was measured by using HLC-8320 GPC (product name, manufactured by Tosoh Corporation) under the conditions of an eluent flow rate of 1 mL/min and a column temperature of 40° C. Tetrahydrofuran was used as the eluent, and Gelpack GL-A150-S/GL-A160-S manufactured by Hitachi Chemical Company, Ltd. was used as the column.

(Measurement of Glass Transition Temperature)

The glass transition temperature Tg of each (meth)acrylic copolymer was measured by using DSC 8230 (product name, manufactured by Rigaku Corporation) under the conditions of a temperature increase rate of 10° C./min and a measurement temperature of −80° C. to 80° C. The glass transition temperature in this case is a mid-point glass transition temperature calculated from changes in the amount of heat according to a method equivalent to JIS K 7121.

(Calculation of Double Bond Equivalent)

The double bond equivalent of each (meth)acrylic copolymer was determined by calculation. The double bond equivalent is the molecular weight per one double bond.

TABLE 1

|     | Weight average molecular weight | Tg (° C.) | Double bond equivalent |
| --- | --- | --- | --- |
| A-1 | 140000 | −10 | 1550 |
| A-2 | 140000 | −10 | 3300 |
| A-3 | 180000 | −10 | 1800 |
| A-4 | 420000 | −40 | 1800 |
| A-5 | 83000  | −10 | 1550 |

<Preparation of Resin Composition for Temporary Protection>

Each component was blended at the composition ratios (unit: parts by mass) shown in Table 2 and Table 3 to prepare resin composition for temporary protection of Examples and Comparative Examples. The details of the non-crosslinkable methacrylic copolymer, the photoradical polymerization initiator, and the silicone compound in the tables are as follows.

[Non-Crosslinkable Methacrylic Copolymer]

LA-2140 (product name, manufactured by Kuraray Co., Ltd., KURARITY)

FS-1208 (product name, manufactured by Lion Specialty Chemicals Co., Ltd.)

[Photoradical Polymerization Initiator]

Irgacure 369 (product name, manufactured by BASF, 2-benzyl-2-dimethylamino-1-(4-morpholin-4-ylphenyl)-butan-1-one).

[Silicone Compound]

BYK-UV 3500 (product name, manufactured by Big Chemie Japan Co., Ltd., acryloyl group-containing polyether-modified polydimethylsiloxane).

TABLE 2

| Material | Name | Example (unit: parts by mass) | | | | | | | | |
| --- | --- | --- | --- | --- | --- | --- | --- | --- | --- | --- |
|  |  | 1 | 2 | 3 | 4 | 5 | 6 | 7 | 8 | 9 |
| (Meth)acrylic copolymer | A-1 | 100 | 100 | 100 | 100 | 100 | — | 70 | 60 | 50 |
|  | A-2 | — | — | — | — | — | — | 30 | 40 | 50 |
|  | A-3 | — | — | — | — | — | 100 | — | — | — |
| Non-crosslinkable (meth)acrylic copolymer | LA2140 | 20 | 30 | 40 | 50 | 60 | — | — | — | — |
| Photoradical polymerization initiator | Irgacure 369 | 1.1 | 1.1 | 1.1 | 1.1 | 1.1 | 0.5 | 0.5 | 0.5 | 0.5 |
| Silicone compound | BYK-UV 3500 | 1.1 | 1.1 | 1.1 | 1.1 | 1.1 | 1.1 | 1.1 | 1.1 | 1.1 |

TABLE 3

| Material | Name | Comparative Example (unit: parts by mass) | | |
|---|---|---|---|---|
| | | 1 | 2 | 3 |
| (Meth)acrylic copolymer | A-1 | 100 | — | — |
| | A-4 | — | 100 | — |
| | A-5 | — | — | 100 |
| Non-crosslinkable (meth)acrylic copolymer | FS-1208 | — | 40 | — |
| Photoradical polymerization initiator | Irgacure 369 | 0.5 | 0.5 | 0.5 |
| Silicone compound | BYK-UV 3500 | 1.1 | 1.1 | 1.1 |

Next, cyclohexanone was further added to the obtained resin composition for temporary protection, and the mixture was stirred and mixed. Stirring was performed until each component became uniform, and a varnish of the resin composition for temporary protection was prepared. The prepared varnish was filtered through a 100-mesh filter and was vacuum degassed. The varnish after vacuum degassing was applied on a polyethylene terephthalate (PET) film having a thickness of 38 µm, which had been subjected to a release treatment, as a base material film. The applied varnish was heated and dried in two stages at 90° C. for 5 minutes and subsequently at 140° C. for 5 minutes. In this manner, a resin film for temporary protection (temporary protective material) having a thickness of 200 µm, which was formed on a base material PET film, was obtained.

<Evaluation of Various Physical Properties>

Evaluation of various physical properties was conducted for the obtained resin films for temporary protection. The evaluation results are shown in Table 4 and Table 5. The chip size was set to 10 mm×10 mm.

[35° C. Shear Viscosity Before Photocuring]

The 35° C. shear viscosity before curing of a resin film for temporary protection was evaluated by the following method.

The melt viscosity at 30° C. to 120° C. was measured by using a rheometer (manufactured by Anton Paar Japan K.K., MCR301) under the conditions of a sample thickness of 200 µm, a temperature increase rate of 10° C./min, and a frequency of 1 Hz, by using a measurement tool (disposable plate (diameter 8 mm) and a disposable sample dish), and the 35° C. shear viscosity was evaluated by using the value at a temperature of 35° C.

[25° C. Elastic Modulus after Photocuring]

The 25° C. elastic modulus after photocuring of the resin film for temporary protection was evaluated by the following method.

The resin film for temporary protection was irradiated with UV at an exposure amount of 500 mJ/cm$^2$ by using a UV-330 HQP-2 type exposure machine (product name, manufactured by ORC MANUFACTURING CO., LTD.), and the resin film for temporary protection was cured. The base material PET film was detached and removed from the resin film for temporary protection, and then the resin film was cut out into a size of 4 mm in width and 30 mm in length to obtain a sample. This was placed on a dynamic viscoelasticity apparatus Rheogel-E4000 (product name, manufactured by UBM), a tensile load was applied, measurement was made at a frequency of 10 Hz and a temperature increase rate of 3° C./min, and the measured value at 25° C. was recorded as the elastic modulus after curing.

[Measurement of Elongation Percentage at Break]

The elongation percentage at break after photocuring of the resin film for temporary protection was evaluated by the following method.

The resin film for temporary protection was irradiated with UV at an exposure amount of 500 mJ/cm$^2$ by using a UV-330 HQP-2 type exposure machine (product name, manufactured by ORC MANUFACTURING CO., LTD.), and the resin film for temporary protection was cured. The base material PET film was detached and removed from the resin film for temporary protection, and then the resin film was cut out into a size of 1 cm in width and 4.2 cm in length to obtain a sample. This was placed on an autograph "AGS-1000" manufactured by SHIMADZU CORPORATION, measurement was made at a distance between chucks of 40 mm and a tensile rate of 300 mm/min, and the elongation percentage at break after curing was measured.

[Level Difference Embedding Properties]

The level difference embedding properties when the resin film for temporary protection is stuck to a body to be processed were evaluated by the following method.

On the surface of a silicon mirror wafer (6 inches) having a thickness of 625 µm, grooves having a width of 40 µm and a depth of 40 µm were formed at an interval of 100 µm by blade dicing. The thus formed silicon mirror wafer with a level difference was placed on a stage of a vacuum laminator LM-50×50-S (product name, manufactured by NPC Incorporated) such that the level difference of the silicon mirror wafer came on the upper surface, a resin film for temporary protection (thickness 200 µm) was installed so as to face the side of the silicon mirror wafer with a level difference, and these were vacuum laminated under the conditions of an air pressure of 1.5 hPa, a lamination temperature of 80° C., a lamination pressure of 0.1 MPa, and a retention time of 2 minutes. Subsequently, the state of embedding the level difference by the resin film for temporary protection was checked by using an ultrasonic microscope Insight-300 (product name, manufactured by Insight k.k.). Specifically, an image captured with the ultrasonic microscope was subjected to color tone correction and black-and-white conversion by using image processing software Adobe Photoshop (registered trademark) to identify void parts. Then, the proportions (%) occupied by the void parts were calculated by means of a histogram. This operation was carried out for five different sites, the average value was taken, and the level difference embedding properties were evaluated according to the following criteria.

○: The proportion of voids was less than 5%.
x: The proportion of voids was 5% or greater.

[Dicing Properties]

The dicing properties of a resin film for temporary protection were evaluated by the following method. A silicon mirror wafer (6 inches) having a thickness of 625 µm was used as a body to be processed, and a resin film for temporary protection (thickness 200 µm) obtained as described above was stuck to this silicon mirror wafer by roll lamination at 40° C. to obtain a silicon mirror wafer equipped with a resin film for temporary protection. The resin film for temporary protection was subjected to UV irradiation at an exposure amount of 500 mJ/cm$^2$ by using a UV-330 HQP-2 type exposure machine (product name, manufactured by ORC MANUFACTURING CO., LTD.), through the resin film for temporary protection side. Then, the base material PET film was detached and removed from the resin film for temporary protection, the resin film was stuck to a dicing tape UC-353EP-110 (product name, manufactured by Furukawa Electric Co., Ltd.), dicing was performed using a fully automatic dicing saw DFD-6361 (product name, manufactured by DISCO Inc.) to obtain a chip. The chip size was set to 10 mm×10 mm. Regarding the blade, ZH05-SD4000-N1-70-BB (product name, manufactured by DISCO Inc.) was used, and the conditions were set to a blade height of 90 μm, a number of blade rotations of 40000 rpm, and a dicing speed of 55 mm/sec. Furthermore, the cutting method was single cutting. In the following evaluation of burring and delamination, a case in which all were rated as ○ was evaluated to have dicing properties ○, and a case in which all were rated as x was evaluated to have dicing properties x.

With regard to burrs, a cross-section of the resin film for temporary protection in the chip after dicing was observed by using a digital microscope VHX-S50 (product name, manufactured by KEYENCE CORPORATION). Observation was carried out at five different sites, and the dicing properties were evaluated according to the following criteria.

○: There was no burr of 5 μm or more coming out from the cross-section.

x: Burrs of 5 μm or more came out from the cross-section.

With regard to delamination, the number of chips present on the dicing tape before and after dicing was each counted by visual inspection, and the results were evaluated according to the following criteria.

○: The residual ratio of the chips was 98% or higher.

x: The residual ratio of the chips was lower than 98%.

[Detachability]

The detachability of the resin film for temporary protection from a body to be processed was evaluated by the following method.

A chip having a size of 10 mm×10 mm produced for the evaluation of dicing properties was conveyed onto a polyimide tape, which is a heat-resistant adhesive material tape, and was stuck thereto. Then, the body to be processed was picked up so as to detach the body to be processed from the cured resin film for temporary protection, by using a die bonder BESTEM-02 (product name, manufactured by Canon Machinery Inc.) under the conditions of a collet size of 9 mm, a number of pins of 13 pins, and a push-up rate of 20 mm/sec. Picking up was performed for fifty chips. The detachability was evaluated according to the following criteria in accordance with the number of chips confirmed to have residues of the resin film for temporary protection.

A: 0 to 10 chips
B: 11 to 20 chips
C: 21 to 50 chips

[Electromagnetic Shield Forming Properties]

The electromagnetic shield forming properties (electromagnetic shielding forming properties) on a body to be processed were evaluated by the following method.

First, a chip having a size of 10 mm×10 mm produced for the evaluation of dicing properties was conveyed onto a polyimide tape, which is a heat-resistant adhesive material tape, and was stuck thereto. Then, a film of copper having a thickness of about 1.8 μm was formed on a body to be processed by using a sputtering apparatus SDH series (product name, manufactured by ULVAC, Inc.) under the conditions of a temperature of 60° C. to 150° C. and a pressure of $7 \times 10^{-1}$ Pa, to form an electromagnetic shield. Subsequently, in the same manner as in the case of the evaluation of detachability, the body to be processed was detached from the cured resin film for temporary protection by using a die bonder BESTEM-02 (product name, manufactured by Canon Machinery Inc.) to obtain a body to be processed having an electromagnetic shield formed thereon. The obtained body to be processed was observed with a microscope, and the electromagnetic shield forming properties were evaluated according to the following criteria.

○: A film of copper was formed over the entire surface except the surface protected with the resin film for temporary protection.

x: A film of copper was not formed over the entire surface except the surface protected with the resin film for temporary protection, or a film of copper was formed even on the surface protected with the resin film for temporary protection.

TABLE 4

| | Example | | | | | | | | |
|---|---|---|---|---|---|---|---|---|---|
| | 1 | 2 | 3 | 4 | 5 | 6 | 7 | 8 | 9 |
| 35° C. shear viscosity (Pa · s) | 9500 | 9300 | 10000 | 10000 | 8700 | 8900 | 8300 | 8500 | 9000 |
| 25° C. elastic modulus (MPa) | 69 | 51 | 47 | 44 | 34 | 66 | 48 | 36 | 28 |
| Elongation percentage at break (%) | 53 | 58 | 60 | 62 | 62 | 49 | 58 | 60 | 62 |
| Level difference embedding properties | ○ | ○ | ○ | ○ | ○ | ○ | ○ | ○ | ○ |
| Dicing properties | ○ | ○ | ○ | ○ | ○ | ○ | ○ | ○ | ○ |
| Detachability (presence or absence of residues) | B | A | A | A | A | B | B | A | A |
| Electromagnetic shield forming properties | ○ | ○ | ○ | ○ | ○ | ○ | ○ | ○ | ○ |

TABLE 5

| | Comparative Example | | |
|---|---|---|---|
| | 1 | 2 | 3 |
| 35° C. shear viscosity (Pa · S) | 10500 | 5500 | 12300 |
| 25° C. elastic modulus (MPa) | 111 | 55 | 123 |
| Elongation percentage at break (%) | 49 | 33 | 49 |
| Level difference embedding properties | ○ | ○ | ○ |
| Dicing properties | ○ | ○ | ○ |

TABLE 5-continued

| | Comparative Example | | |
|---|---|---|---|
| | 1 | 2 | 3 |
| Detachability (presence or absence of residues) | C | C | C |
| Electromagnetic shield forming properties | ○ | ○ | ○ |

As is obvious from the results shown in Table 4 and Table 5, it was confirmed that an electronic component having an electromagnetic shield at a desired part and having excellent reliability is obtained.

REFERENCE SIGNS LIST

1: substrate, 2: protrusion, 10: body to be processed, 20, 20c: temporary protective material, 30: base material film, 40: dicing tape, 50: heat-resistant adhesive material tape, M: metal film, C: collet.

The invention claimed is:

1. A method for producing an electronic component having an electromagnetic shield, the method comprising:
   sticking a temporary protective material to a first portion of a body to be processed, wherein the temporary protective material embeds irregularities on a surface of the body to be processed;
   photocuring the temporary protective material by a light irradiation;
   singularizing the body to be processed and the temporary protective material;
   forming a metal film on a second portion of the singularized body where the temporary protective material is not stuck, the metal film providing the second portion of the body with the electromagnetic shield; and
   detaching the singularized body having the metal film formed thereon from the temporary protective material to obtain the electronic component having the electromagnetic shield,
   wherein the temporary protective material is formed from a resin composition having a shear viscosity at 35° C. of 5000 to 30000 Pa·s, before said photocuring by the light irradiation, and having an elastic modulus at 25° C. of 100 MPa or less and an elongation percentage of 35% or more in a tensile test, after said photocuring by the light irradiation with an exposure amount of 500 mJ/cm$^2$ or greater.

2. The method according to claim 1, wherein the resin composition comprises a (meth)acrylic copolymer containing a carbon-carbon double bond-containing group.

3. The method according to claim 2, wherein a weight average molecular weight of the (meth)acrylic copolymer is 100000 to 350000.

4. The method according to claim 2, wherein a double bond equivalent of the (meth)acrylic copolymer is 500 to 4000.

5. The method according to claim 2, wherein a glass transition temperature of the (meth)acrylic copolymer is −30° C. to 10° C.

6. The method according to claim 2, wherein the resin composition further comprises a photoradical polymerization initiator.

7. The method according to claim 2, wherein the resin composition further comprises a silicone compound.

8. The method according to claim 1, wherein the temporary protective material has a film shape.

9. A resin composition for the temporary protective material that is used in the method according to claim 1, the resin composition comprising:
   a (meth)acrylic copolymer containing a carbon-carbon double bond-containing group;
   a photoradical polymerization initiator; and
   a silicone compound.

10. The resin composition according to claim 9, wherein a weight average molecular weight of the (meth)acrylic copolymer is 100000 to 350000.

11. The resin composition according to claim 9, wherein a double bond equivalent of the (meth)acrylic copolymer is 500 to 4000.

12. The resin composition according to claim 9, wherein a glass transition temperature of the (meth)acrylic copolymer is −30° C. to 10° C.

13. A resin film for temporary protection obtained by forming the resin composition according to claim 9 into a film shape.

14. The resin composition according to claim 9, further comprising a non-crosslinkable (meth)acrylic resin.

15. A temporary protection film for producing an electronic component having an electromagnetic shield, the temporary protection film comprising:
   a (meth)acrylic copolymer containing a carbon-carbon double bond-containing group;
   a photoradical polymerization initiator; and
   a silicone compound,
   wherein the temporary protective film is photocured by a light irradiation during production of the electronic component,
   wherein the temporary protective film has a shear viscosity at 35° C. of 5000 to 30000 Pa·s before photocuring by the light irradiation, and
   wherein the temporary protective film has an elastic modulus at 25° C. of 100 MPa or less and an elongation percentage of 35% or more in a tensile test, after photocuring by the light irradiation with an exposure amount of 500 mJ/cm$^2$ or greater.

* * * * *